US008245761B2

(12) United States Patent
Han et al.

(10) Patent No.: US 8,245,761 B2
(45) Date of Patent: Aug. 21, 2012

(54) HEAT SINK

(75) Inventors: Lei Han, Shenzhen (CN); Jun Ding, Shenzhen (CN); Ye-Fei Yu, Shenzhen (CN); Jun Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 644 days.

(21) Appl. No.: 12/483,266

(22) Filed: Jun. 12, 2009

(65) Prior Publication Data
US 2010/0132919 A1 Jun. 3, 2010

(30) Foreign Application Priority Data

Dec. 3, 2008 (CN) .......................... 2008 1 0305938

(51) Int. Cl.
*F28F 3/08* (2006.01)
(52) U.S. Cl. ...................................... 165/80.3; 361/703
(58) Field of Classification Search ................. 165/80.2, 165/80.3; 361/703
See application file for complete search history.

(56) References Cited

U.S. PATENT DOCUMENTS

| 6,772,828 | B1 * | 8/2004 | Chen ............................... 165/78 |
| 6,871,698 | B2 * | 3/2005 | Lee et al. ..................... 165/80.3 |
| 7,028,755 | B2 * | 4/2006 | Fu et al. ....................... 165/80.3 |
| 7,721,790 | B2 | 5/2010 | Sung |
| 2004/0104013 | A1 | 6/2004 | Yeh |

FOREIGN PATENT DOCUMENTS

| CN | 2697822 | 5/2005 |
| CN | 101083892 | 12/2007 |

* cited by examiner

*Primary Examiner* — Teresa Walberg
(74) *Attorney, Agent, or Firm* — Altis Law Group, Inc.

(57) ABSTRACT

A heat sink includes a plurality of metal fins interconnected together. Each metal fin includes a main plate, a flange extending forwardly from the main plate and an interlocking unit formed on the flange. The interlocking unit includes an engaging ear and a hook. The ear extends rearwards from a rear edge of the flange and defines a locking hole therein. The flange defines a cutout adjacent to a front edge thereof. The cutout is aligned with the ear and recessed rearwards from the front edge of the flange. The hook extends forwardly from the flange and is located within the cutout. The ear of a fin is engaged in the cutout of an adjacent rear fin. The hook of the adjacent rear fin is engaged in the locking hole of the engaging ear of the fin.

12 Claims, 8 Drawing Sheets

HEAT SINK

BACKGROUND

1. Technical Field

The disclosure generally relates to heat sinks, and particularly to a heat sink having a plurality of interlocked fins that are material saving.

2. Description of Related Art

It is well known that electronic components such as central processing units (CPUs) of computers generate a large amount of heat during operation. In order to remove the heat generated by the CPU quickly, a cooling device such as a heat sink is generally used to dissipate the heat. Typically, the heat sink includes a plurality of metal fins which are disposed in parallel with each other.

In earlier day, a heat sink generally includes a flat base and a plurality of metal fins integrally formed with and extending upwardly from the base. The heat sink is typically an aluminum heat sink and is manufactured by an extrusion process. It is well known by those skilled in the art that, if the heat sink is integrally formed by an extrusion process, the metal fins of the heat sink cannot be made to have a large enough surface area available for heat dissipation. For example, a height of each of the metal fins and a spacing between every two of the metal fins are seriously restricted in the extrusion process.

Presently, most of the heat sinks are not an integral one. The metal fins of the heat sink are manufactured separately and then combined with each other by interlocking units formed between them. FIG. 1 shows a conventional heat sink. The heat sink includes a plurality of metal fins 90 stacked with each other. Each metal fin 90 includes a main plate 91 and a pair of flanges 92 extending perpendicularly from upper and lower sides of the main plate 91. The metal fin 90 has four interlocking units 93 formed at four corners of the metal fin 90, respectively. Each interlocking unit 93 includes an ear 95 and a projection 94. The ear 95 extends forwardly from a front edge of the flange 92 towards a front adjacent fin 90. The projection 94 extends upwardly from a top edge of the main plate 91. A hole 96 is defined in the flange 92 between the ear 95 and the projection 94. In assembly, the metal fins 90 are arranged parallel to each other. The ear 95 of a rear metal fin 90 is received in a corresponding hole 96 of a neighboring front metal fin 90, and the projection 94 of the neighboring front metal fin 90 abuts an inner edge of the ear 95 of the rear metal fin 90. Thus, the fins 90 are locked together.

FIG. 2 shows a metal sheet used for manufacturing the metal fin 90 of the heat sink of FIG. 1. A region between each two adjacent broken lines 98 functions as a boundary of the main plate 91 and the flange 92. Because the ears 95 extend outwardly from an outer edge of each flange 92, a leftover material 97 needs to be provided at the outer edge of each flange 92 to form the ears 95, thereby increasing an area of a metal sheet used for manufacturing the metal fin 90. For instance, when the metal fin 90 has a size of 1709.5 mm$^2$ (square millimeter) (length=131.5 mm; width=13 mm, i.e., a width of the main plate 91 plus the two flanges 92 before the flanges 92 are bent relative to the main plate 91), a metal sheet used for forming the metal fin 90 needs a larger size of 2380.15 mm$^2$ (length=131.5 mm; width=18.1 mm, i.e., a width of the main plate 91 and the two flanges 92 plus the two leftover materials 97). Therefore, the metal sheet for forming the metal fin 90 of the conventional heat sink needs a large area and the leftover materials form waste of material.

For the foregoing reasons, therefore, there is a need in the art for heat sink which overcomes the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 3:
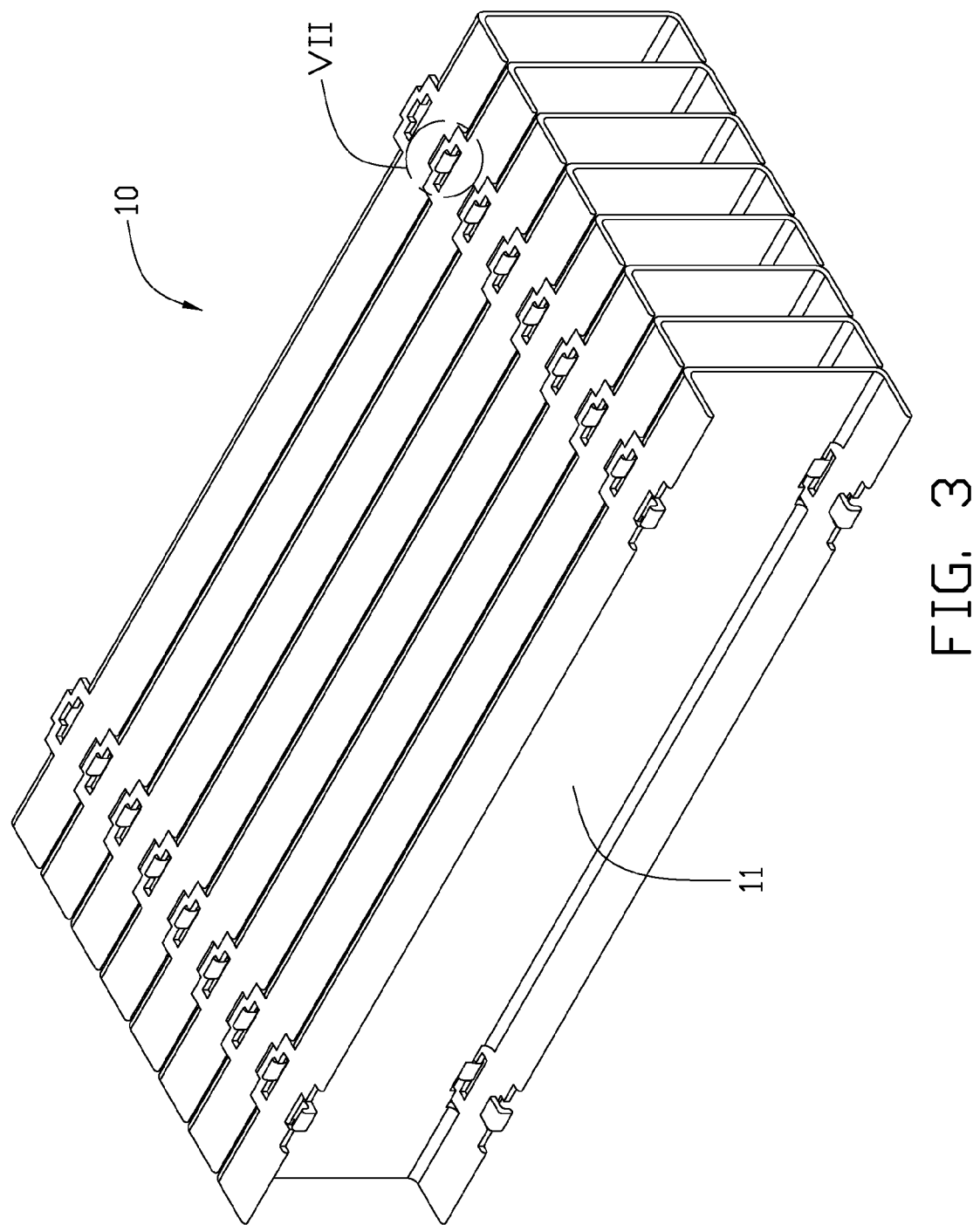
FIG. 3 is an assembled, isometric view of a heat sink in accordance with an exemplary embodiment of the present invention.
Figure 4:
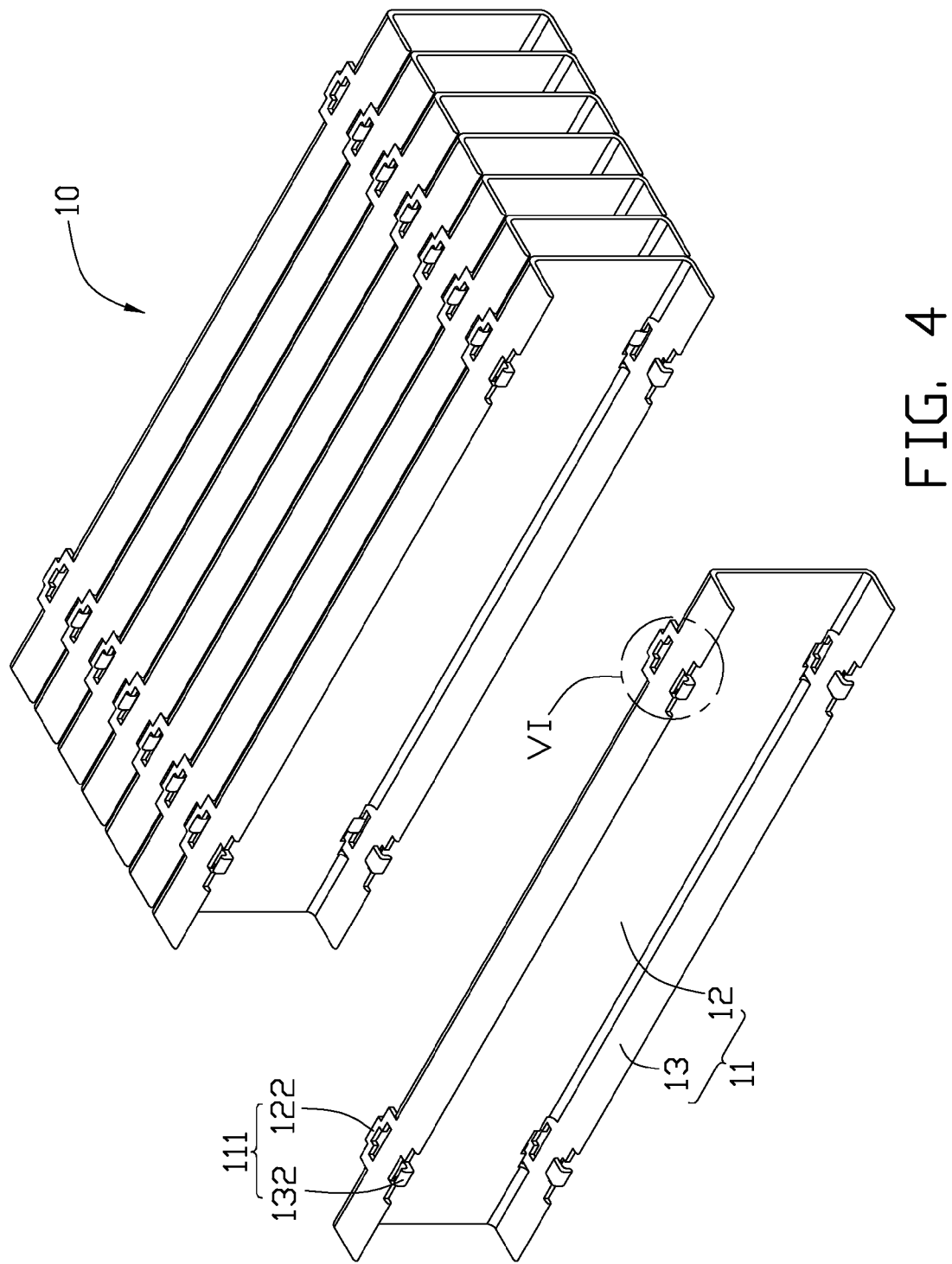
FIG. 4 is a partially exploded, isometric view of the heat sink of FIG. 3.

Referring to FIGS. 3-4, a heat sink 10 according to an exemplary embodiment of the present invention includes a plurality of interlocked metal fins 11. Each metal fin 11 is substantially U-shaped, and includes a flat main plate 12 and two flanges 13 bending from the main plate 12. The main plate 12 is rectangular in profile. The two flanges 13 extend perpendicularly and forwardly from two opposite sides (i.e., a top side and a bottom side) of the main plate 12, respectively.

Figure 5:
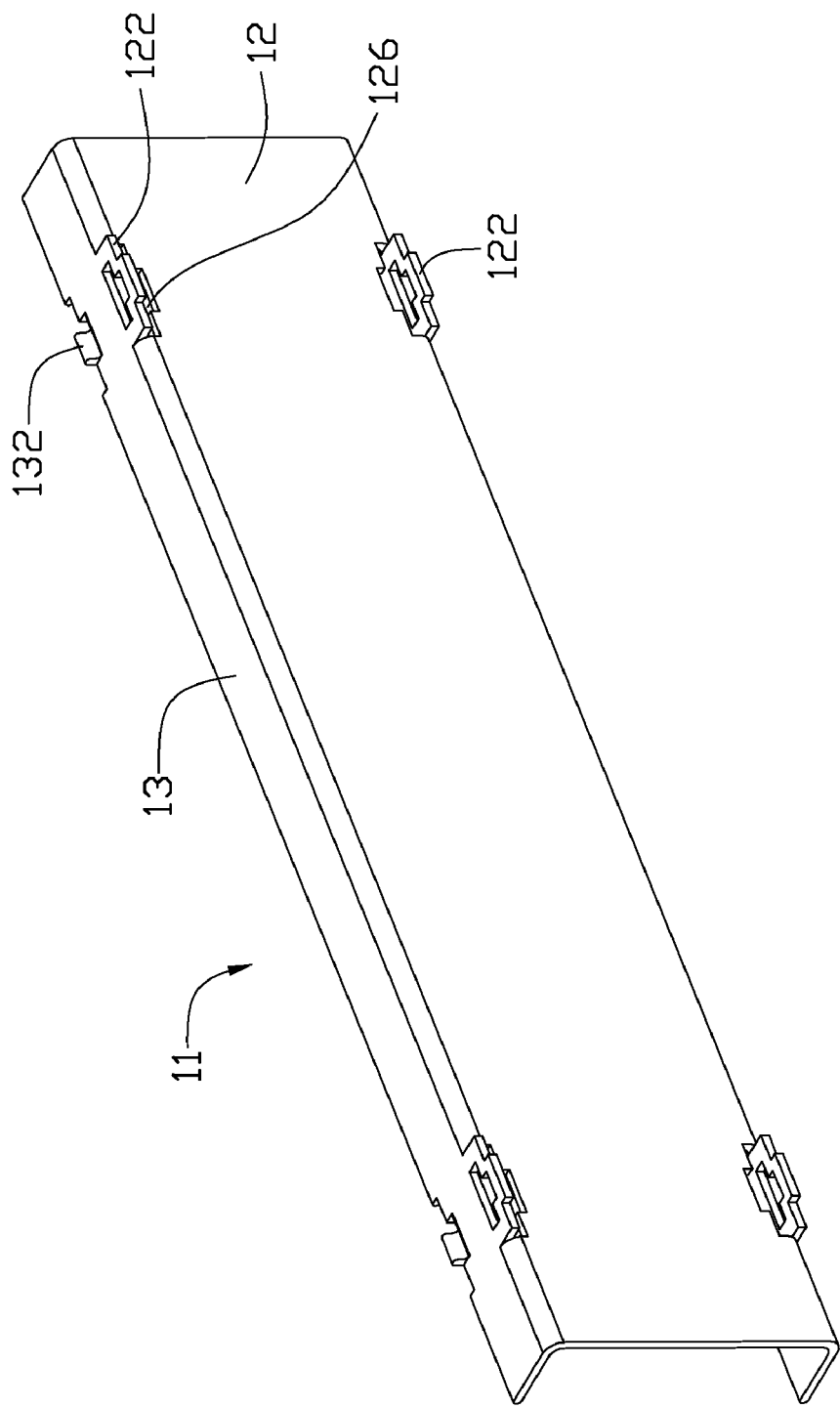
FIG. 5 is an isometric view of a metal fin of the heat sink of FIG. 3, viewed from another aspect.
Figure 6:
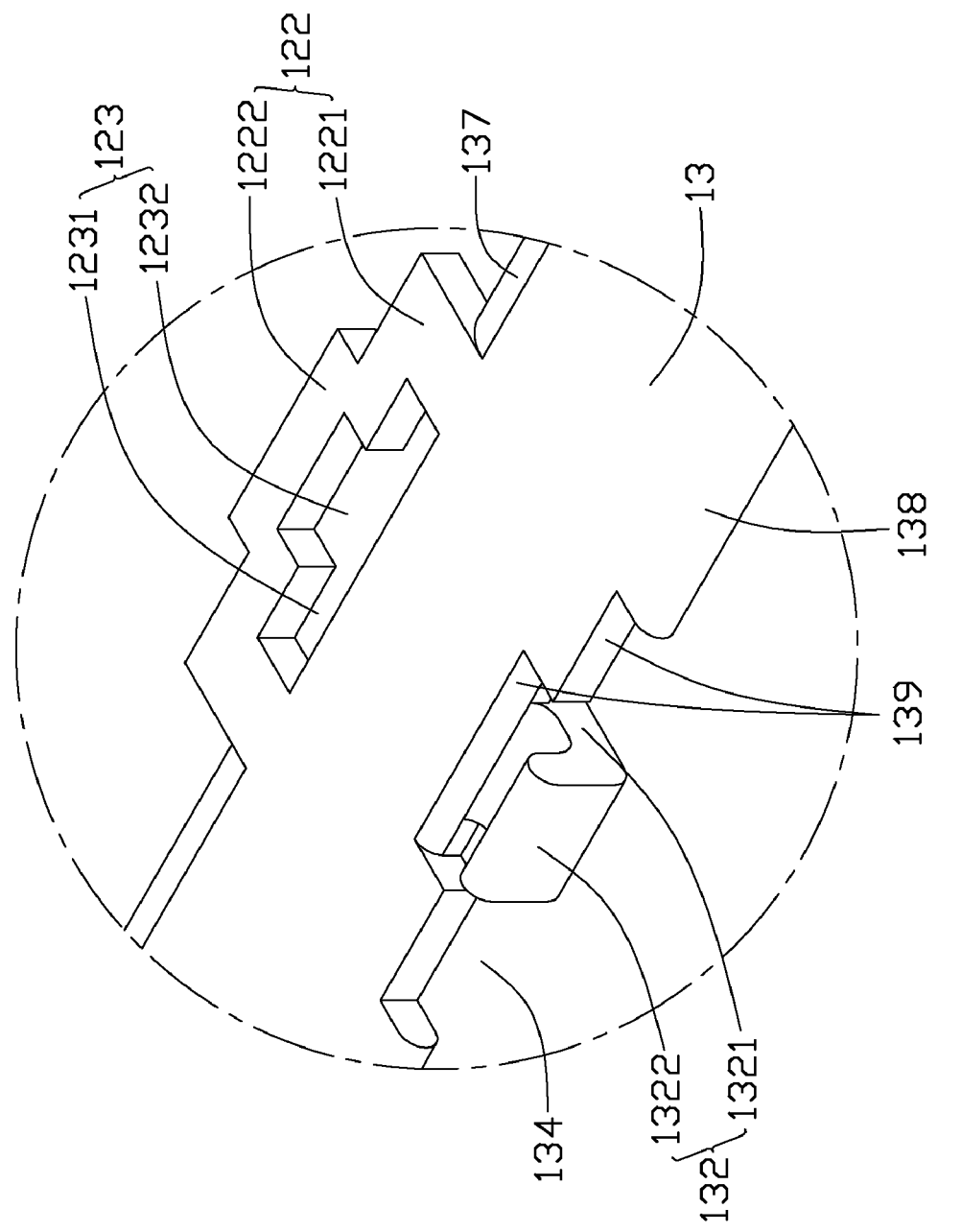
FIG. 6 is an enlarged view of a circled portion VI of FIG. 4.

Referring also to FIGS. 5-6, the metal fin 11 has four interlocking units 111 formed at four corners of the metal fin 11, respectively. Each of the interlocking units 111 includes an engaging ear 122 and a hook 132. Each of the flanges 13 has a rear edge 137 connecting with the main plate 12 and an opposite front edge 138. The engaging ear 122 extends horizontally and backwardly from the rear edge 137 of the flange 13, and is substantially located in a same plane with the flange 13. The engaging ear 122 is formed by punching a portion of the main plate 12 adjacent to the flange 13 perpendicularly and backwardly, thereby forming a corresponding opening 126 in the main plate 12 under the engaging ear 122. The engaging ear 122 includes an inner wide part 1221 connecting with the flange 13 and an outer narrow part 1222 extending outwardly from a free end of the wide part 1221. The engaging ear 122 defines a locking hole 123 in a center portion thereof. The locking hole 123 has a profile similar to that of the engaging ear 122, each of which is T-shaped. The locking hole 123 includes an inner wide portion 1231 adjacent to the flange 13 and an outer narrow portion 1232 communicating with the wide portion 1231 and spaced from the flange 13 by the wide portion 1231.

The flange 13 defines a cutout 134 in a front portion thereof corresponding to the engaging ear 122. The cutout 134 is aligned with the engaging ear 122 and extends inwardly from the front edge 138 to a concave edge 139 of the flange 13. The hook 132 extends forwardly from a middle, rear part of the concave edge 139 of the flange 13 and is aligned with the narrow portion 1232 of the locking hole 123. The hook 132 is located within the cutout 134. In other words, the hook 132 does not extend beyond the front edge 138 of the flange 13. After bending, the flange 13 can be located at a top of the main plate 12 as shown in FIG. 6, or located at a bottom of the main plate 12. Taking the upper flange 13 of FIG. 6 as an example, the hook 132 is formed by punching the front portion of the upper flange 13 downwardly, meanwhile the cutout 134 is defined in the front portion of the upper flange 13. The cutout 134 has a profile similar to the engaging ear 122, i.e., a T-shaped profile, to thereby receive the engaging ear 122 of an adjacent front metal fin 11 therein. The hook 132 is L-shaped, and includes an inner extending portion 1321 connecting with the upper flange 13 and an outer clasping portion 1322 bent upwardly (i.e., along a direction from a bottom side to a top side of the upper flange 13) from a free end of the extending portion 1321. The extending portion 1321 of the hook 132 is depressed inwardly. The extending portion 1321 has a height lower than the upper flange 13, and a top end of the clasping portion 1322 of the hook 132 is higher than the upper flange 13. Here please be noted that for the lower flange 13, the outer clasping portion 1322 is bent downwardly (i.e., along a direction from a top side to a bottom side of the lower flange 13) from the free end of the extending portion 1321. In addition, the extending portion 1321 has a height higher than the lower flange 13, and a lower end of the clasping portion 1322 of the hook 132 is lower than the lower flange 13 (better seen in FIGS. 3-4).

Figure 7:
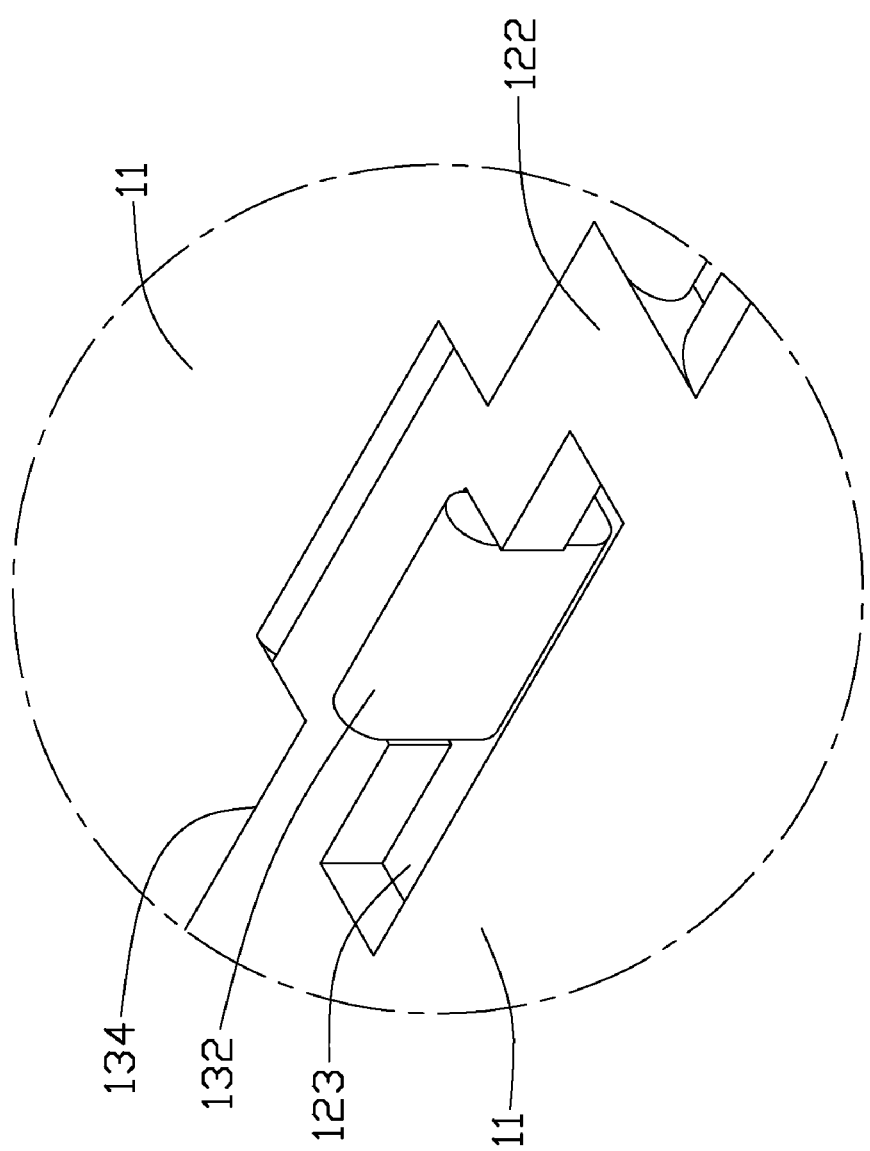
FIG. 7 is an enlarged view of a circled portion VII of FIG. 3.

Referring also to FIG. 7, in assembly, the metal fins 11 are arranged parallel to each other, with the hooks 132 of a rear metal fin 11 being aligned with the engaging ears 122 of a front metal fin 11, respectively. The front metal fin 11 is then pushed toward the rear metal fin 11. Thus, the hooks 132 of the rear metal fin 11 are brought into interaction with the corresponding engaging ears 122 of the front metal fin 11 to cause the hooks 132 of the rear metal fin 11 to elastically deform inwardly towards the main plate 12 of the rear metal fin 11. Once the clasping portions 1322 of the hooks 132 of the rear metal fin 11 arrive at the locking holes 123 of the corresponding engaging ears 122 of the front metal fin 11, the hooks 132 of the rear metal fin 11 elastically restore back to their original shape and position. The clasping portions 1322 of the hooks 132 of the rear metal fin 11 are engaged into the narrow portions 1232 of the locking holes 123 of the corresponding engaging ears 122 of the front metal fin 11 and resist against inner edges of the narrow parts 1222 of the engaging ears 122. At the same time, the engaging ears 122 of the front metal fin 11 are engaged into the cutouts 134 of the rear metal fin 11. Thus, the front and rear fins 11 are locked together. Other metal fins 11 are sequentially assembled to the front metal fin 11 in a similar fashion for stacking the metal fins 11 into an assembly. Thus, the metal fins 11 are combined together to form the heat sink 10.

Figure 1:
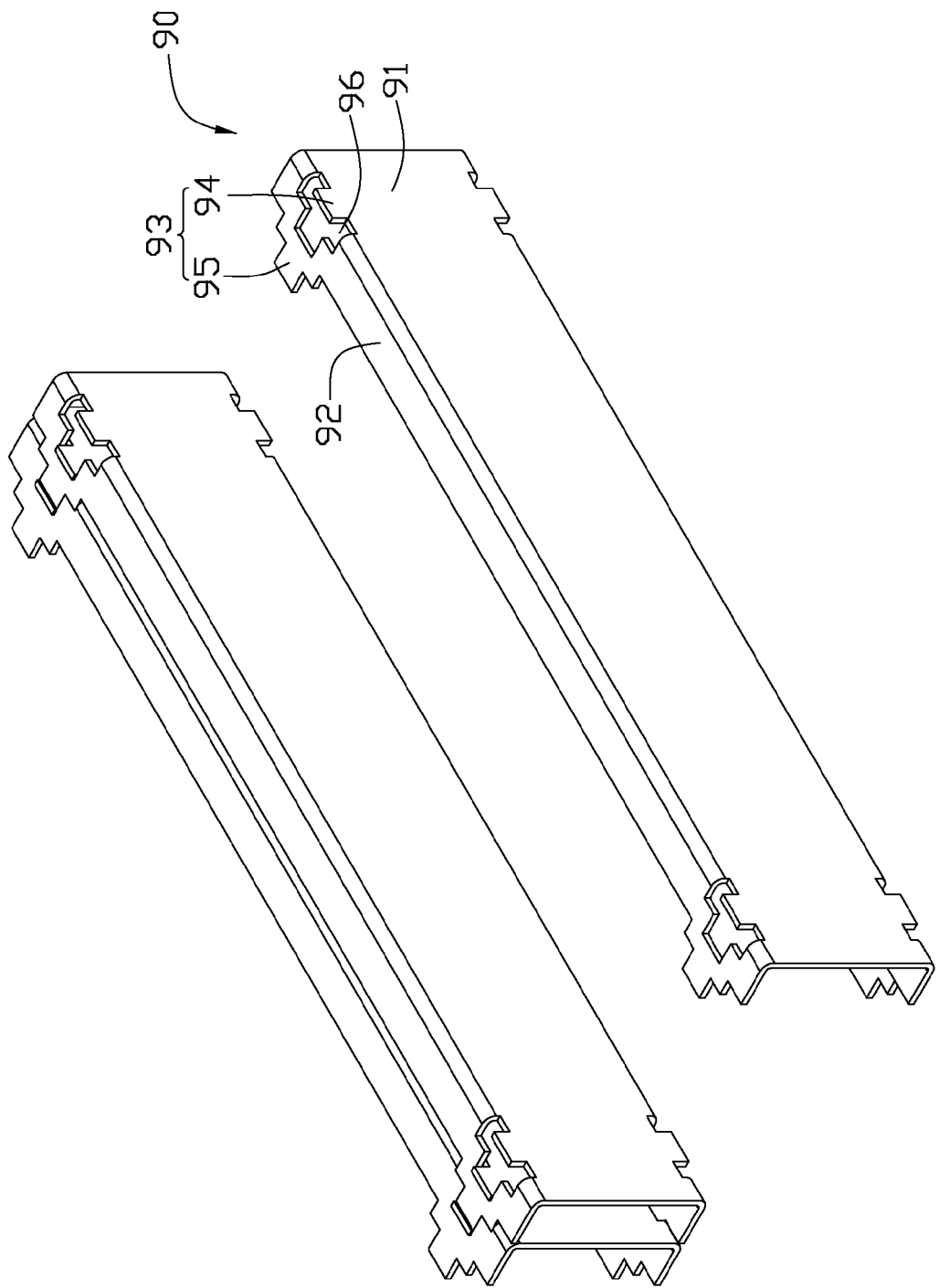
FIG. 1 is a partially exploded view of a heat sink in accordance with a related art.
Figure 2:
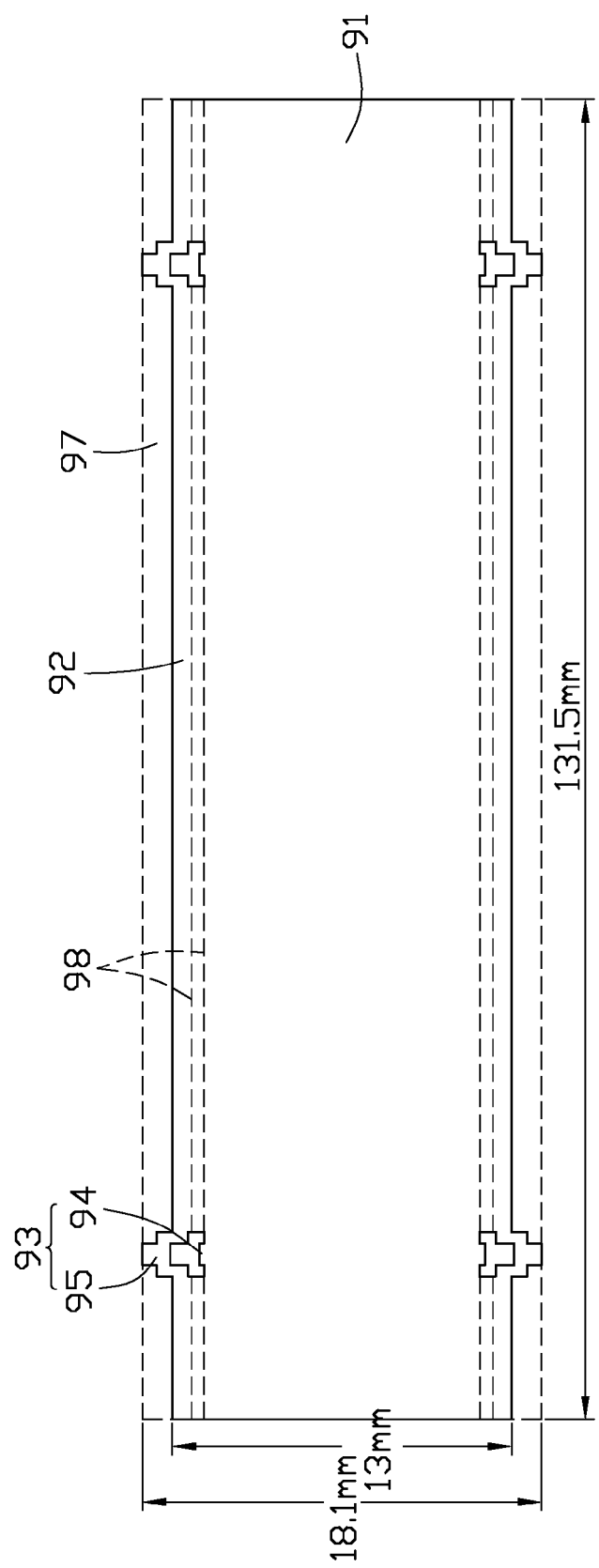
FIG. 2 shows a metal sheet used for manufacturing a metal fin of the heat sink of FIG. 1.
Figure 8:
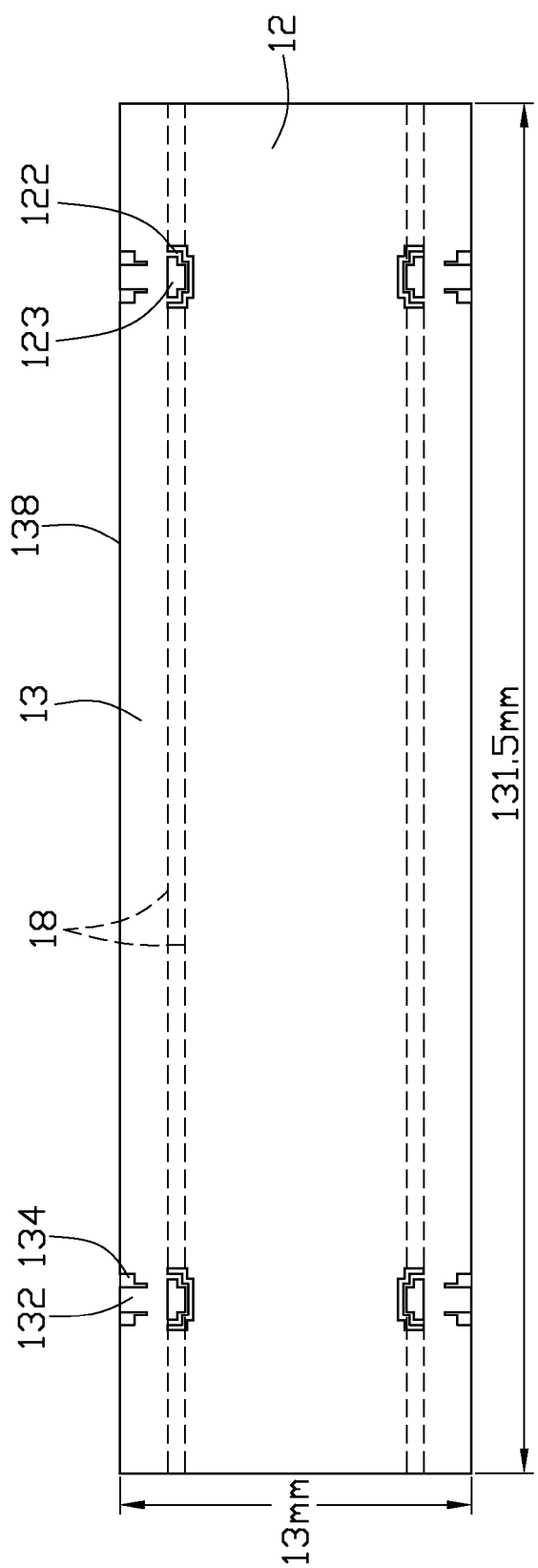
FIG. 8 shows a metal sheet used for manufacturing the metal fin of FIG. 5.

FIG. 8 shows a metal sheet used for manufacturing the metal fin 11 of FIG. 5. A region between each two adjacent broken lines 18 functions as a boundary of the main plate 12 and the flange 13. The engaging ears 122 and the locking holes 123 are formed by punching portions of the region of the metal sheet between each two adjacent broken lines 18. The engaging ears 122 and the locking holes 123 are located at the main plate 12 adjacent to the flange 13 when the metal fin 11 is formed from the metal sheet. The hooks 132 and the cutouts 134 are formed by punching portions of the metal sheet for forming the flange 13, which are located adjacent to the front edge 138 thereof. Because the hooks 132 are punched from portions of the flange 13 adjacent to the front edge 138 thereof, no leftover materials need to be provided in front of the front edge 138 of the flange 13. A material of the metal sheet used for manufacturing the metal fin 11 is reduced. For instance, when the metal fin 11 has a size of 1709.5 mm$^2$ (length=131.5 mm; width=13 mm), a metal sheet used for forming the metal fin 11 only needs to be provided with a size of 1709.5 mm$^2$ (length=131.5 mm; width=13 mm). Comparing with the conventional metal fin 90 shown in FIG. 1, the material of the metal sheet used for forming the metal fin 11 of the present embodiment is reduced by 28.18% (a reduced area=2380.15 mm$^2$−1709.5 mm$^2$=670.65 mm$^2$). Thus, the manufacture cost of the heat sink 10 is greatly reduced.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink comprising:
   a plurality of metal fins interconnected together, each of the metal fins comprising:
   a main plate;
   at least one flange extending forwardly from the main plate, the at least one flange having a rear edge connecting with the main plate and an opposite front edge; and
   at least one interlocking unit formed on the at least one flange, the at least one interlocking unit comprising an engaging ear and a hook, the engaging ear extending rearwards from the rear edge of the at least one flange and defining a locking hole therein, the at least one flange defining a cutout adjacent to the front edge thereof corresponding to the engaging ear, the cutout being aligned with the engaging ear and recessed rearwards from the front edge of the at least one flange, the hook extending forwardly from the at least one flange and being located within the cutout, the hook being L-shaped, and comprising an inner extending portion connecting with the at least one flange and an outer clasping portion bent upwardly from a free end of the extending portion, the extending portion of the hook being depressed downwardly and having a height lower than the at least one flange, the clasping portion of the hook of the adjacent rear fin being engaged in the locking hole of the engaging ear of the fin;
   wherein the engaging ear of a fin is engaged in the cutout of an adjacent rear fin, and the hook of the adjacent rear fin is engaged in the locking hole of the engaging ear of the fin.

2. The heat sink of claim 1, wherein the engaging ear is punched from a portion of the main plate adjacent to the at least one flange, and the hook is punched from a portion of the at least one flange adjacent to the front edge thereof.

3. The heat sink of claim 1, wherein the engaging ear is located in a same plane with the flange.

4. The heat sink of claim 1, wherein the engaging ear comprises a wide part connecting with the at least one flange and a narrow part extending rearwards from a free end of the wide part, the locking hole comprises an inner wide portion adjacent to the at least one flange and an outer narrow portion communicating with the wide portion and spaced from the at least one flange via the inner wide portion, and the hook of the adjacent rear fin is engaged in the outer narrow portion of the locking hole of the engaging ear of the fin.

5. The heat sink of claim 4, wherein the clasping portion of the hook of the adjacent rear fin is engaged in the outer narrow portion of the locking hole of the engaging ear of the fin.

6. A heat sink comprising:
   a plurality of metal fins interconnected together, each of the metal fins comprising:
   a main plate;
   two flanges extending forwardly from top and bottom sides of the main plate, each of the two flanges having a rear edge connecting with the main plate and an opposite front edge; and
   four interlocking units formed at four corners of the metal fin, respectively, each of the four interlocking units comprising an engaging ear and a hook, the engaging ear extending rearwards from the rear edge of a corresponding flange and defining a locking hole therein, the engaging ear comprising a wide part connecting with the corresponding flange and a narrow part extending outwardly from a free end of the wide part, the locking hole comprising an inner wide portion adjacent to the corresponding flange and an outer narrow portion communicating with the wide portion, and the hook of the adjacent rear fin being engaged in the narrow portion of the locking hole of the engaging ear of the fin, the corresponding flange defining a cutout adjacent to the front edge thereof corresponding to the engaging ear, the cutout being aligned with the locking hole of the engaging ear and recessed rearwards from the front edge of the corresponding flange, the hook extending forwardly from the corresponding flange and being located within the cutout, the hook being L-shaped, and comprising an inner extending portion connecting with the corresponding flange and an outer clasping portion bent outwardly from a free end of the extending portion, the extending portion of the hook being depressed inwardly, the clasping portion of the hook of the adjacent fin being engaged in the locking hole of the engaging ear of the fin;
   wherein the engaging ear of a fin is engaged in a corresponding cutout of an adjacent rear fin, and the hook of the adjacent rear fin is engaged in the locking hole of the engaging ear of the fin.

7. The heat sink of claim 6, wherein the engaging ear is punched from a portion of the main plate adjacent to the corresponding flange, and the hook is punched from a portion of the corresponding flange adjacent to the front edge thereof.

8. The heat sink of claim 6, wherein the engaging ear is located in a same plane with the corresponding flange.

9. The heat sink of claim 6, wherein the clasping portion of the hook of the adjacent rear fin is engaged in the narrow portion of the locking hole of the engaging ear of the fin.

10. A heat sink comprising:
    a plurality of metal fins interconnected together, each of the metal fins comprising:
    a main plate;
    at least one flange extending forwardly from the main plate, the at least one flange having a rear edge connecting with the main plate and an opposite front edge; and
    at least one interlocking unit formed on the at least one flange, the at least one interlocking unit comprising an engaging ear and a hook, the engaging ear extending rearwards from the rear edge of the at least one flange and defining a locking hole therein, the engaging ear comprising a wide part connecting with the at least one flange and a narrow part extending rearwards from a free end of the wide part, the locking hole comprising an inner wide portion adjacent to the at least one flange and an outer narrow portion communicating with the wide portion and spaced from the at least one flange via the inner wide portion, and the hook of the adjacent rear fin being engaged in the outer narrow portion of the locking hole of the engaging ear of the fin, the at least one flange defining a cutout adjacent to the front edge thereof corresponding to the engaging ear, the cutout being aligned with the engaging ear and recessed rearwards from the front edge of the at least one flange, the hook extending forwardly from the at least one flange and being located within the cutout, the hook comprising an inner extending portion connecting with the at least one flange and an outer clasping portion bent upwardly from a free end of the extending portion, the extending portion of the hook being depressed downwardly and having a height lower than the at least one flange, the clasping portion of the hook of the adjacent rear fin being engaged in the outer narrow portion of the locking hole of the engaging ear of the fin;
    wherein the engaging ear of a fin is engaged in the cutout of an adjacent rear fin, and the hook of the adjacent rear fin is engaged in the locking hole of the engaging ear of the fin.

11. The heat sink of claim 10, wherein the engaging ear is punched from a portion of the main plate adjacent to the at least one flange, and the hook is punched from a portion of the at least one flange adjacent to the front edge thereof.

12. The heat sink of claim 10, wherein the engaging ear is located in a same plane with the flange.

* * * * *